(12) United States Patent
Chen et al.

(10) Patent No.: US 7,990,200 B2
(45) Date of Patent: Aug. 2, 2011

(54) PULSE WIDTH MODULATION CONTROL SYSTEM

(75) Inventors: Shi-Tao Chen, Shenzhen (CN);
Hsiang-Jui Hung, Taipei Hsien (TW);
Sheng-Chung Huang, Taipei Hsien (TW); Kun-Lung Wu, Taipei Hsien (TW); Yi-Ping Li, Taipei Hsien (TW)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 12/563,148

(22) Filed: Sep. 20, 2009

(65) Prior Publication Data

US 2010/0321080 A1 Dec. 23, 2010

(30) Foreign Application Priority Data

Jun. 19, 2009 (CN) .......................... 2009 1 0303445

(51) Int. Cl.
*H03K 3/00* (2006.01)
(52) U.S. Cl. .................. 327/295; 327/172; 327/297
(58) Field of Classification Search .................. None
See application file for complete search history.

(56) References Cited

U.S. PATENT DOCUMENTS 7,230,219 B2 * 6/2007 Miyazaki et al. ............. 219/715
2010/0268969 A1 * 10/2010 Rui .............................. 713/300
* cited by examiner

*Primary Examiner* — An T Luu
(74) *Attorney, Agent, or Firm* — Frank R. Niranjan

(57) ABSTRACT

A PWM control system includes a multi-phase PWM controller and at least one single-phase PWM controller. The multi-phase PWM controller is capable of generating a multi-phase PWM signal. The at least one single-phase PWM controller is capable of generating a single-phase PWM signal. A phase difference between the single-phase PWM signal and the multi-phase signal is greater than 0 degree and less than 180 degree.

12 Claims, 5 Drawing Sheets

PULSE WIDTH MODULATION CONTROL SYSTEM

BACKGROUND

1. Technical Field

The present disclosure relates to PWM (Pulse width modulation) control systems, and more particularly to a PWM control system with both single-phase and multi-phase PWM signals.

2. Description of Related Art

Referring to FIG. 1, an example of a 4-phase power supply for a CPU (Central Processing Unit) of a motherboard includes a 4-phase PWM controller sending a PWM signal. The PWM signal includes four phase outputs connecting to four driver ICs (Integrated Circuit) correspondingly. Each of the driver ICs is adapted to switch on/off a pair of MOSFETs for adjusting an output voltage (Vout) supplied to the CPU. Relative to a single-phase power supply, a multi-phase power supply utilizes many pairs of MOSFETs, thereby capable of decreasing a working time of each of the MOSFETs and decreasing heat generated by each of the MOSFETs. Thus, components of the multi-phase power supply performance more reliably.

A typical PWM control system for adjusting the CPU power supply may utilize both a multi-phase PWM controller and single-phase PWM controllers. The multi-phase PWM controller and the single-phase PWM controllers can operate individually or jointly for ensuring the CPU power supply is continuous and at an appropriate voltage level.

FIG. 2 illustrates waveforms of PWM signals and associated ripple currents in the typical PWM control system. PWM1 signal is a 4-phase signal (Phase1, Phase2, Phase3, and Phase4). PWM2 signal and PWM3 signal are both single-phase signals. Pulses of the PWM2 signal is delayed relative to that of the Phase1 signal of the PWM1 signal, and pulses of the PWM3 signal is delayed relative to that of the phase2 signal of the PWM1 signal. A delay time T is ½ cycle (180 degrees). Only one pulse of the PWM2 or PWM3 signal can be inserted in one cycle [f1] of the PWM1 signal. Then, the pulses of the PWM1, PWM2, PWM3 signals are regular, and ripple currents associated with the PWM1, PWM2, PWM3 signals are not superposed, and a total ripple current is not increased. However, a pulse frequency of the PWM signals (PWM1, PWM2, and PWM3) cannot be further increased since only one pulse of the PWM2 or PWM3 signal can be inserted in one cycle of the PWM1 signal.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

Figure 3:
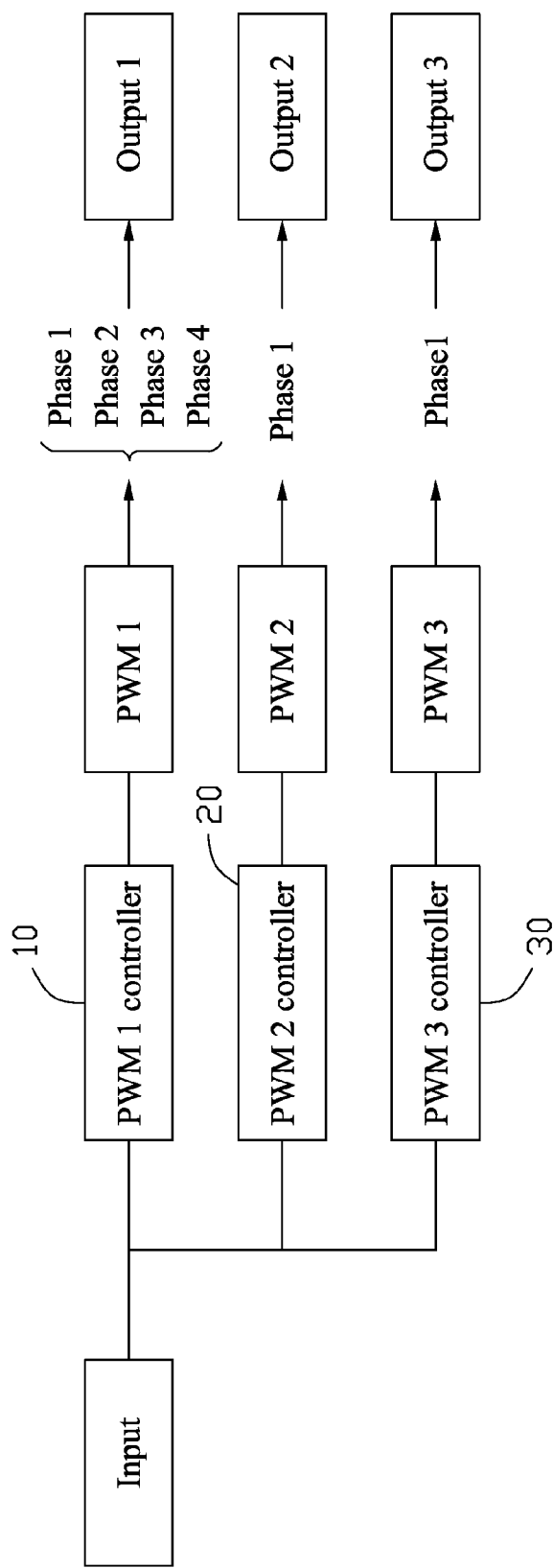
FIG. 3 illustrates an embodiment of a PWM control system according to the present disclosure.

Referring to FIG. 3, an embodiment of a pulse width modulation (PWM) control system includes a first PWM controller 10, a second PWM controller 20, and a third PWM controller 30. The first PWM controller 10 is a multi-phase PWM controller capable of generating a multi-phase PWM1 signal. The PWM1 signal includes a first phase signal (Phase1), a second phase signal (Phase2), a third phase signal (Phase3), and a fourth phase signal (Phase4). The second PWM controller 20 and the third PWM controller 30 are each a single-phase PWM controller capable of generating a single-phase PWM signal. The PWM1, PWM2, PWM3 signals are utilized for adjusting a power supply to an electrical component, such as a central processing unit (CPU), on a motherboard.

Figure 4:
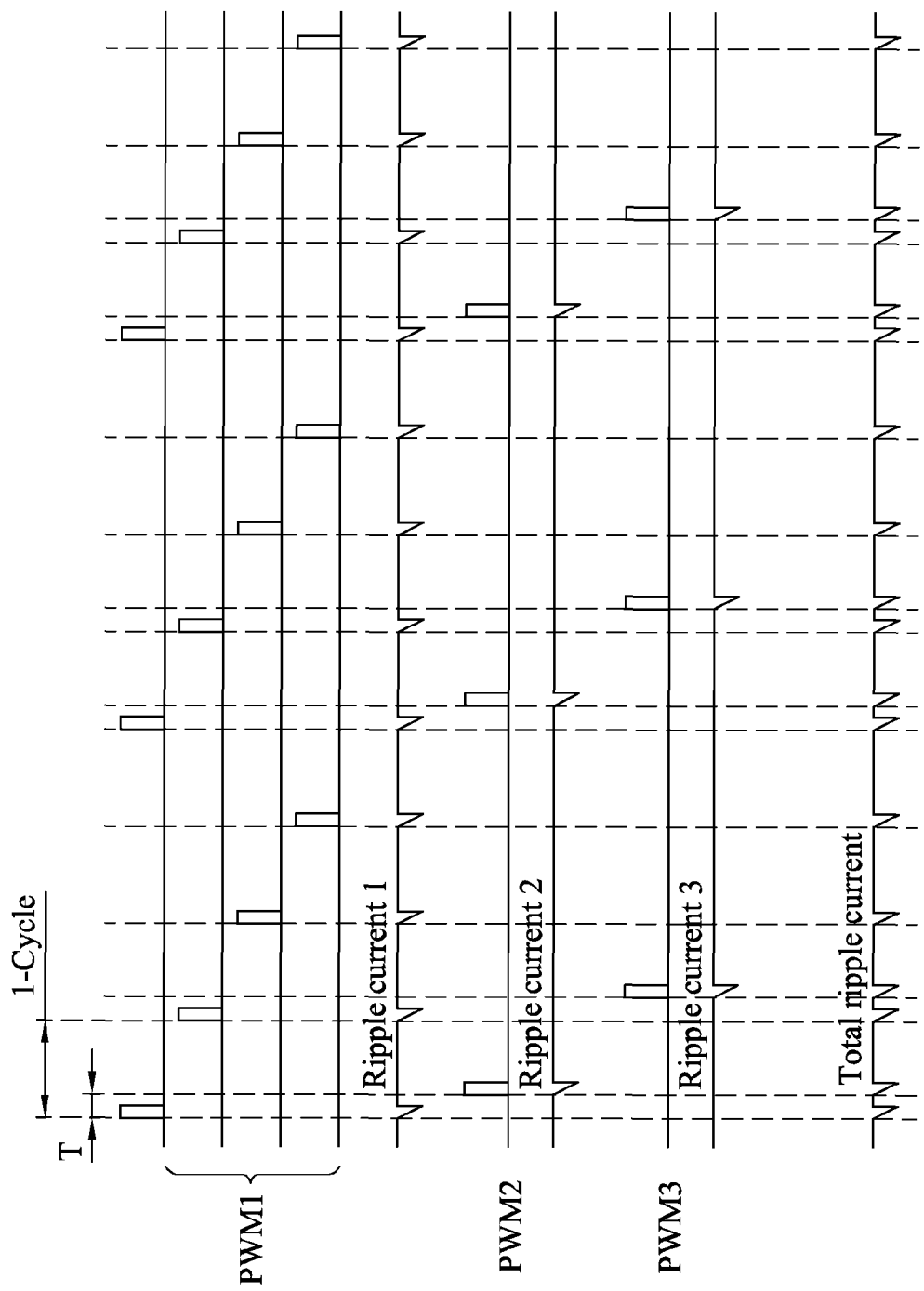
FIG. 4 illustrates waveforms of PWM signals and current ripples in the PWM control system of FIG. 3 according to the present disclosure.

Referring to FIG. 4, pulses of the PWM2 signal are delayed relative to that of the Phase1 of the PWM1 signal, and pulses of the PWM3 signal is delayed relative to that of the Phase2 of the PWM1 signal. A delay time T is greater than 0 and less than ½ cycle. A phase difference between the PWM 2 signal and the PWM1 signal (e.g. 60 degree, 120 degree) is greater than 0 degrees and less than 180 degrees. A phase difference between the PWM 3 signal and the PWM1 signal (e.g. 60 degree, 120 degree) is greater than 0 degree and less than 180 degrees.

Figure 1:
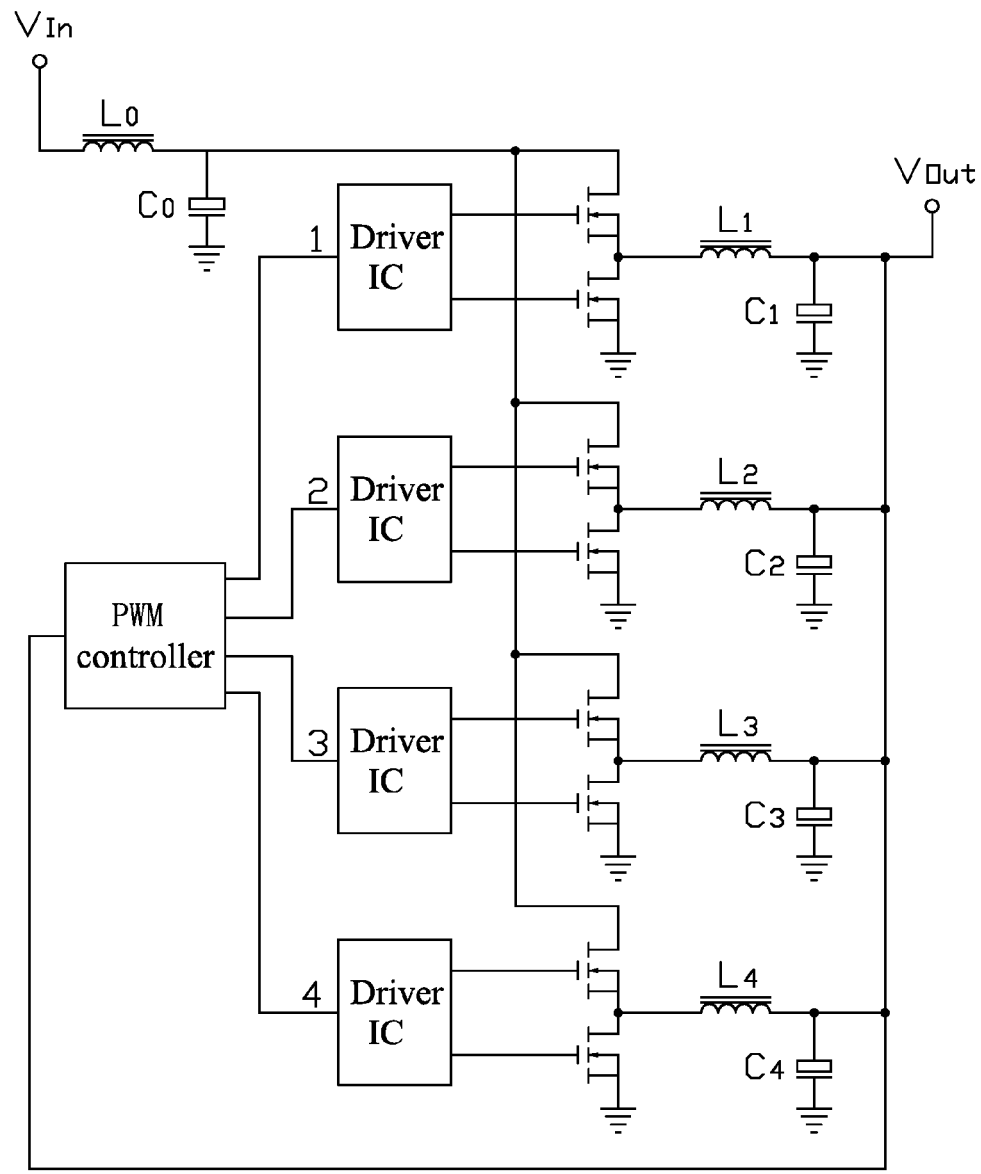
FIG. 1 is a block diagram of a typical 4-phase CPU power supply circuit.
Figure 2:
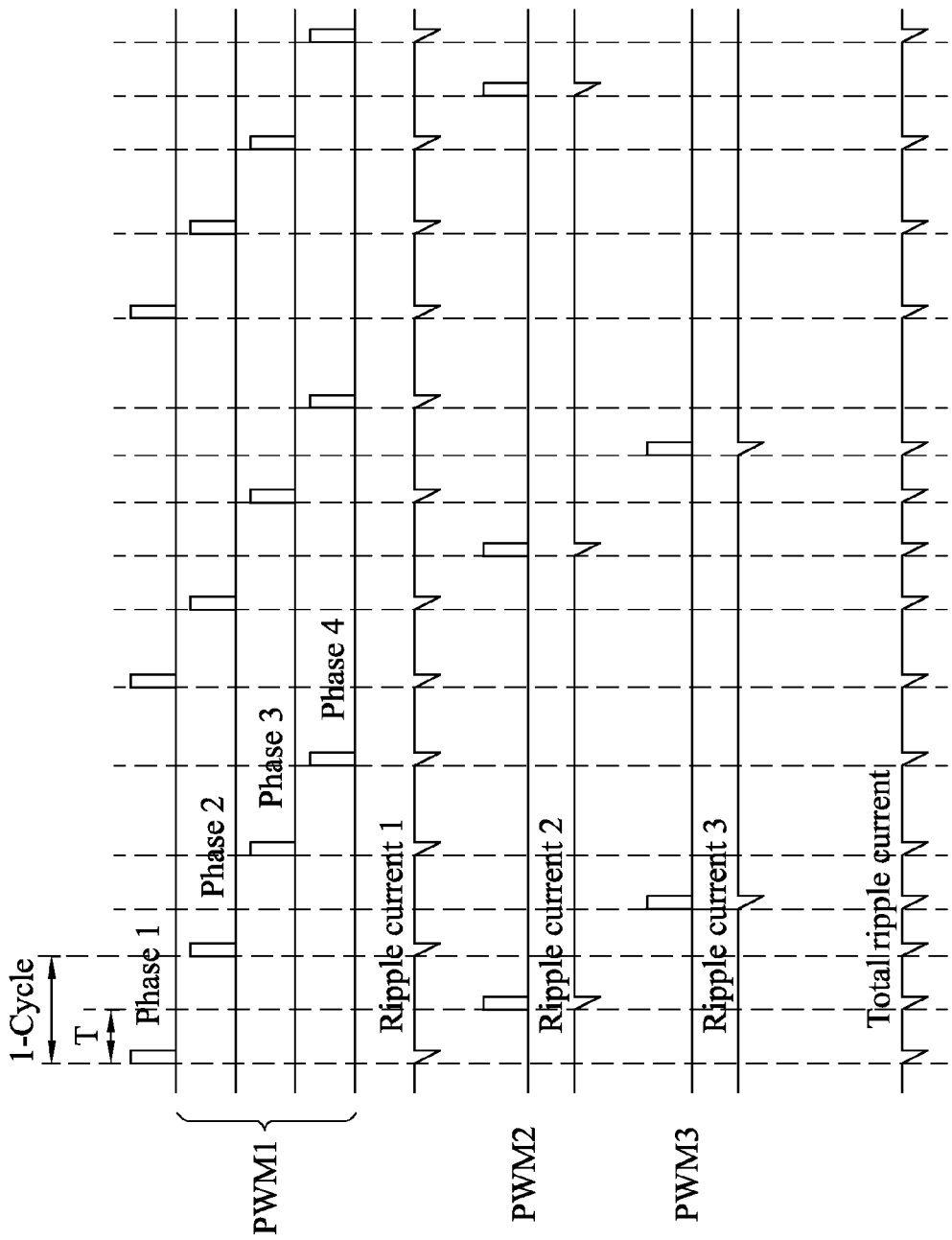
FIG. 2 illustrates waveforms of PWM signals and current ripples in a typical PWM control system.
Figure 5:
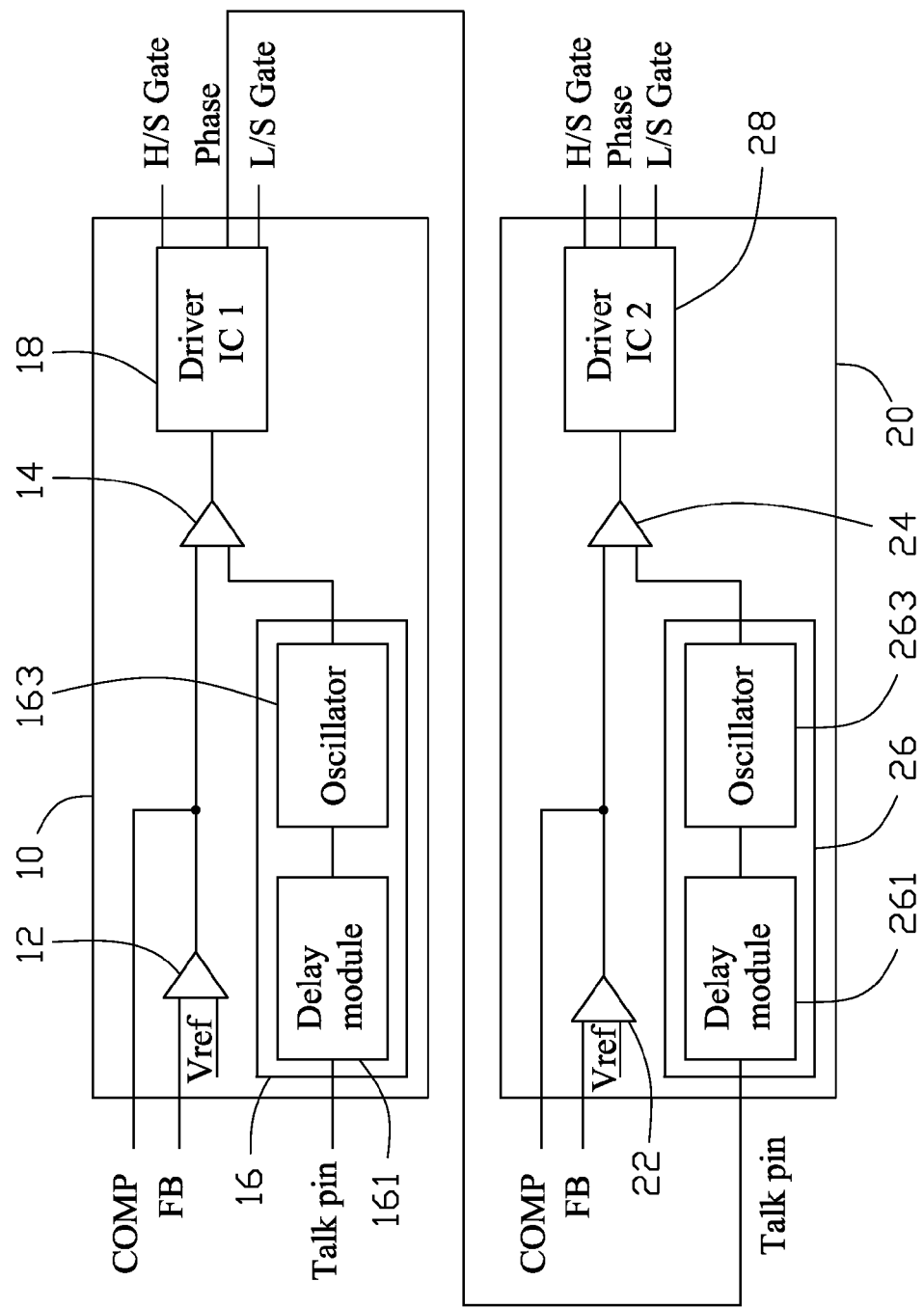
FIG. 5 illustrates a portion of a block diagram of the PWM control system in FIG. 3 according to the present disclosure.

Referring to FIG. 5, a portion of the first PWM controller 10 includes a first amplifier 12, a second amplifier 14, a first phase shift module 16, and a first diver IC 18. A first input terminal of the first amplifier 12 is fed with a feedback signal to monitor an output voltage supplied to the electrical component on the motherboard. A second input terminal of the first amplifier 12 is fed with a reference voltage signal (Vref). The first amplifier 14 is capable of comparing the feedback (FB) signal and the reference voltage signal (Vref) to determine whether the feedback signal is in a required range. An output terminal of the first amplifier 12 is connected to the first input terminal of the second amplifier 14. The first input terminal of the second amplifier 14 is further fed with a compensation signal (COMP). A second input terminal of the second amplifier 14 is connected to an output terminal of the first phase shift module 16. An output terminal of the second amplifier 14 is connected to an input pin of the first driver IC 18. The first phase shift module 16 includes a delay module 161 capable of delaying signals and an oscillator 163 for generating a clock signal. The first driver IC 18 includes an H/S Gate pin, a Phase pin, an L/S Gate pin. The H/S Gate pin and the L/S Gate pin correspondingly switches a pair of MOSFETS (see FIG. 1) for adjusting the output voltage supplied to the electrical component. The Phase pin is capable of outputting one phase of the PWM1 signal (Phase1, Phase2, Phase3, or Phase 4 signal) and connected to a talk pin of the second PWM controller 20. The first PWM controller 10 further includes other similar portions arranged in parallel for outputting other phases of the PWM1 signal (not shown).

The first amplifier 12, the second amplifier 14, and the first phase shift module 16 may be integrated in a single signal processing chip. The first driver IC1 18 is capable of integrated in the chip or may be an independent component externally connected to the chip.

The second PWM controller 20 includes a third amplifier 22, a fourth amplifier 24, a second phase shift module 26, and a second driver IC 28 with connections similar to the first PWM controller 10 as described above. The second phase shift module 26 includes a delay module 261 for delaying one phase of the PWM1 signal and an oscillator 263 for generating a clock signal. One phase of the PWM1 signal output from the phase pin of the first PWM controller 10 is sent to the second phase shift module 26 of the second PWM controller 20 via the talk pin. The one phase of the PWM1 signal is delayed by the second phase shift module 26. Thus, the second output controller 20 outputs the PWM2 with a phase difference relative to the PWM1 signal via a phase pin.

Similarly, the third PWM controller 30 (see FIG. 3) is also connectable to the first PWM controller via its talk pin. A plurality of PWM controllers are capable of connecting to each other. Each of the PWM controllers has at least a phase output pin connected to the electrical component for adjusting an output voltage. The output voltage remains at the required voltage level, but a total output current supplied to the electrical component is increased for improving a working power (P=UI) of the electrical component.

It is to be understood, however, that even though numerous characteristics and advantages of the present disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A PWM (Pulse Width Modulation) control system comprising:
    a first PWM controller capable of generating a multi-phase PWM signal; and
    a second PWM controller capable of generating a single-phase PWM signal;
    wherein a phase difference between the single-phase PWM signal and the multi-phase PWM signal is greater than 0 degree and less than 180 degrees; and the multi-phase PWM signal comprises a first phase signal and a second phase signal that is delayed a cycle relative to the first phase signal, and the single-phase PWM signal is delayed less than a half of the cycle relative to the multi-phase PWM signal;
    wherein each of the first and second PWM controllers comprises a phase shift module, one phase output of the first PWM controller is connected to the phase shift module of the second PWM controller.

2. The PWM control system of claim 1, wherein the multi-phase PWM signal is combined of four phase signals.

3. The PWM control system of claim 1, wherein a phase difference between the single-phase PWM signal and the multi-phase PWM signal is 60 degrees.

4. The PWM control system of claim 1, wherein a phase difference between the single-phase PWM signal and the multi-phase PWM signal is 120 degrees.

5. The PWM control system of claim 1, wherein the phase shift module of the second PWM controller comprises a time delay module for delaying one phase output of the multi-phase PWM signal and an oscillator for generating a clock signal.

6. The PWM control system of claim 5, further comprising a third PWM controller connected to the first PWM controller.

7. The PWM control system of claim 1, wherein each of the first, second, and third PWM controllers comprises a first amplifier, a second amplifier, and a driver module, an output terminal of the first amplifier is connected to one input terminal of the second amplifier, the phase shift module is connected to another input terminal of the second amplifier, and an output terminal of the second amplifier is connected to the driver module.

8. The PWM control system of claim 7, wherein the first amplifier, the second amplifier, and the driver module are capable of being integrated in one chip with a phase pin for sending one phase signal, two switch control pins for switching on/off a pair of switch members in turn.

9. A PWM control system comprising:
    a first PWM controller capable of generating a multi-phase PWM signal;
    a second PWM controller capable of generating a first single-phase PWM signal; and
    a third PWM controller capable of generating a second single-phase PWM signal;
    wherein a phase difference between the first single-phase PWM signal and the multi-phase PWM signal or the second single-phase PWM signal is greater than 0 degree and less than 180 degrees; the multi-phase PWM signal comprises a first phase signal and a second phase signal that is delayed a cycle relative to the first phase signal, the first single-phase PWM signal is delayed less than a half of the cycle relative to the first phase signal, and the second single-phase PWM signal is delayed less than the half of the cycle relative to the second phase signal;
    wherein each of the first, second, and third PWM controllers comprises a phase shift module capable of changing a phase degree of the multi-phase or single-phase PWM signal; one phase output terminal of the first PWM controller is connected to the phase shift module of the second PWM controller.

10. The PWM control system of claim 9, wherein the first PWM signal is a combination of four phase signals.

11. The PWM control system of claim 9, wherein the phase shift module comprises a time delay module capable of delaying signals and an oscillator capable of generating a clock signal.

12. The PWM control system of claim 9, wherein each of the PWM controllers comprises a first amplifier, a second amplifier, and a driver module, an output terminal of the first amplifier is connected to one input terminal of the second amplifier, the phase shift module is connected to another input terminal of the second amplifier, and an output terminal of the second amplifier is connected to the driver module.

* * * * *